(12) United States Patent
Jack, Jr. et al.

(10) Patent No.: US 6,472,872 B1
(45) Date of Patent: Oct. 29, 2002

(54) REAL-TIME SHIMMING OF POLARIZING FIELD IN MAGNETIC RESONANCE SYSTEM

(75) Inventors: Clifford R. Jack, Jr., Rochester, MN (US); Heidi A. Ward, Rochester, MN (US); Stephen J. Riederer, Rochester, MN (US)

(73) Assignee: Mayo Foundation for Medical Education and Research, Rochester, MN (US)

( * ) Notice: Subject to any disclaimer, the term of this patent is extended or adjusted under 35 U.S.C. 154(b) by 0 days.

(21) Appl. No.: 09/896,549

(22) Filed: Jun. 29, 2001

(51) Int. Cl.[7] .................................................. G01V 3/00
(52) U.S. Cl. ...................................... 324/309; 324/307
(58) Field of Search .............................. 324/309, 307, 324/312, 314, 318, 320; 128/653.2; 600/410, 413

(56) References Cited

U.S. PATENT DOCUMENTS

| | | | |
|---|---|---|---|
| 4,623,843 A | 11/1986 | Macovski | 324/309 |
| 4,970,457 A | 11/1990 | Kaufman et al. | 324/309 |
| 5,488,950 A | 2/1996 | Ehnholm | 324/309 |
| 5,539,312 A * | 7/1996 | Fu et al. | 324/309 |
| 5,684,401 A | 11/1997 | Peck et al. | 324/309 |
| 6,275,720 B1 * | 8/2001 | Du et al. | 600/410 |
| 6,292,684 B1 * | 9/2001 | Du et al. | 600/410 |
| 6,341,179 B1 * | 1/2002 | Stoyle et al. | 382/254 |
| 6,404,196 B1 * | 6/2002 | Duerk et al. | 324/309 |

* cited by examiner

Primary Examiner—Edward Lefkowitz
Assistant Examiner—Brij B. Shrivastav
(74) Attorney, Agent, or Firm—Quarles & Brady, LLP

(57) ABSTRACT

An fMRI scan is performed with an MRI system in which a series of single shot EPI pulse sequences are performed to acquire a series of images. A shim navigator pulse sequence is interleaved with the EPI pulse sequence to acquire data with which the MRI system polarizing magnetic field can be measured. Measured changes in the polarizing field during the scan are employed to calculate corrective changes in the scan parameters that offset phase errors caused by changes in the polarizing field.

18 Claims, 6 Drawing Sheets

REAL-TIME SHIMMING OF POLARIZING FIELD IN MAGNETIC RESONANCE SYSTEM

STATEMENT REGARDING FEDERALLY SPONSORED RESEARCH

This invention was made with government support under Grant No. CA73691 and AG16574 awarded by the National Institute of Health. The United States Government has certain rights in this invention.

BACKGROUND OF THE INVENTION

The field of the invention is nuclear magnetic resonance (NMR) methods and systems. More particularly, the invention relates to the compensation of NMR systems for variations in the polarizing magnetic field.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. An NMR signal is emitted by the excited spins after the excitation signal $B_1$ is terminated, and this signal may be received and processed.

When utilizing these NMR signals to produce images, magnetic field gradients ($G_x$, $G_y$ and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

It is required that the polarizing field $B_0$ be stable during the series of imaging sequences, which may have a duration of a few seconds to fifteen minutes. The required stability is quite high, and typically changes of from 0.1 to a few parts per million (ppm) can degrade the spectra or image. The stability requirement is thus quite severe, and is especially difficult to achieve in resistive and permanent magnets, as opposed to superconducting magnets.

The instabilities may be caused by external disturbances, (e.g. moving ferrous masses such as elevators), and imperfections in the magnet system. In resistive magnets such imperfections include instabilities in the magnet current and thermal contraction of the coils. In permanent magnets the ambient temperature affects both the dimensions of the magnet and the flux produced by its material and thus this type of magnet is quite sensitive to thermal fluctuations.

The polarizing field stability requirement has been addressed in U.S. Pat. No. 4,623,843 of Macovski, and U.S. Pat. No. 4,417,209 of Hounsfield. They teach how to measure the presence of unwanted fluctuations in the polarizing field $\Delta B_0$ and how to use the measured signal to compensate for $\Delta B_0$. This $\Delta B_0$ measurement is done by NMR, using a separate reference sample located outside the imaged object but inside the $B_0$ field region. The reference sample can be excited separately or by the same RF excitation field as that of the object. The reference signal from the sample produces an NMR signal having a frequency $f_0+\Delta f_0$, which is proportional to $B_0+\Delta B_0$. The measured frequency changes $\Delta f_0$ are used for demodulating the acquired NMR signals received from the object, thus compensating for the $\Delta B_0$ instabilities during reception. Methods for compensating the magnitude of the polarizing field $B_0$ during excitation of the object are also described. In addition to the cost of added $B_0$ sensors and associated circuitry, the signal-to-noise (S/N) ratio of the NMR sensor is at best only a little better than needed and at worst it can degrade the final image quality.

As disclosed in U.S. Pat. No. 5,488,950, one solution to these problems is to employ electron-spin resonance (ESR) as a means for measuring changes in the polarizing magnetic field. As with NMR, ESR employs a strong polarizing magnetic field to measure resonant signals, but in ESR the resonant signals are produced by electrons rather than nuclei. ESR typically operates at microwave frequencies and employs electronics and coil structures that are substantially different than those employed in NMR. One difficulty with this solution is the substantial cost of the additional ESR circuitry.

Another approach is disclosed in U.S. Pat. No. 4,970,457 which interleaves the imaging pulse sequences performed during the scan with pulse sequences that do not employ phase encoding. The echo signals produced by these interleaved pulse sequences are Fourier transformed and the peak is detected and used as a measure of the polarizing field $B_0$. While this method detects changes in the magnitude of the polarizing field in the region of the imaged slice, it does not provide any information regarding $B_0$ gradients produced by the polarizing field across the imaging volume.

When performing functional magnetic resonance imaging (fMRI), pulse sequences having long transmit repeat (TR) times are employed and multiple NMR echo signals are acquired. Such pulse sequences (e.g. echo planar imaging (EPI) sequences) are characterized by low SNR signals acquired at a very low band width per pixel in the phase encoding direction of the image. These are particularly sensitive to phase errors caused by non-uniform fields and the like. They are repeated a number of times during a study to acquire a series of images depicting the brain over a time course. It has been discovered that even small movements of a subject's head during an fMRI study can disturb the $B_0$ polarizing field sufficiently to produce warping and artifacts in acquired fMRI images. These perturbations of the polarizing field are localized within the subject and include not only changes in the polarizing field magnitude throughout the imaging volume, but also changes in that magnitude as a function of position within the imaging volume. In other words, $B_0$ gradients are produced across the imaging volume.

SUMMARY OF THE INVENTION

The present invention is a method for performing an MRI scan in which shim navigator NMR signals are acquired during the scan that enable changes in the polarizing magnetic field to be measured throughout the duration of the scan. The measured polarizing field changes may be employed to prospectively correct acquired NMR data by changing one or more scan parameters such as the imaging pulse sequence gradient waveforms.

An object of the invention is to provide a shim navigator pulse sequence which acquires a navigator NMR signal that enables the changes in the $B_0$ field along any arbitrary axis within the imaging volume to be measured. Each shim navigator pulse sequence acquires two NMR echo signals, and after each is fast-Fourier transformed, the phase difference between the two is calculated to provide an indication of the spatially dependent polarizing field ($B_0$). The measured $B_0$ field is compared with a reference, or baseline, value obtained at the beginning of the scan to determine the change in polarizing magnetic field.

Another object of the invention is to correct for changes in the polarizing magnetic field that occur in the subject being imaged during a scan. By acquiring shim navigator NMR signals read out along three orthogonal axes, motion-induced changes in the polarizing field $B_0$ in any arbitrary direction(s) within the subject can be measured across the entire imaging volume.

DESCRIPTION OF THE PREFERRED EMBODIMENT

Figure 1:
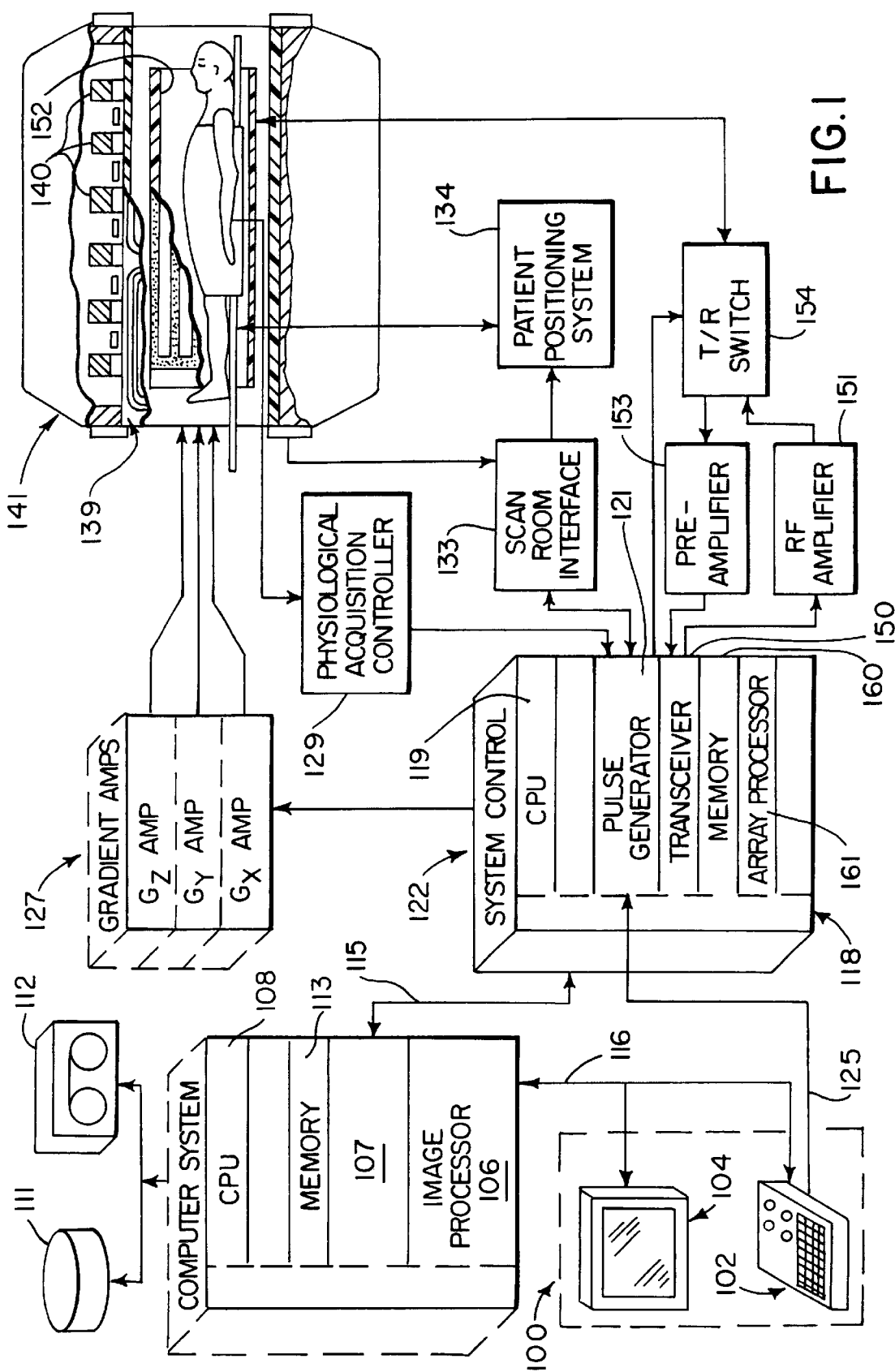
FIG. 1 is a block diagram of an MRI system which has been modified to employ the present invention.

Referring first to FIG. 1, there is shown the major components of a preferred MRI system which incorporates the present invention. The operation of the system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan. The gradient waveforms produced by the pulse generator module 121 are applied to a gradient amplifier system 127 comprised of $G_x$, $G_y$ and $G_z$ amplifiers. Each gradient amplifier excites a corresponding gradient coil in an assembly generally designated 139 to produce the magnetic field gradients used for position encoding acquired signals.

The gradient coil assembly 139 forms part of a magnet assembly 141 which includes a polarizing magnet 140 and a whole-body RF coil 152. A transceiver module 150 in the system control 122 produces pulses which are amplified by an RF amplifier 151 and coupled to the RF coil 152 by a transmit/receive switch 154. The resulting signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode.

The NMR signals picked up by the RF coil 152 are digitized by the transceiver module 150 and transferred to a memory module 160 in the system control 122. When the scan is completed and an entire array of data has been acquired in the memory module 160, an array processor 161 operates to Fourier transform the data into an array of spectroscopic or image data. This data is conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the display 104.

Figure 2:
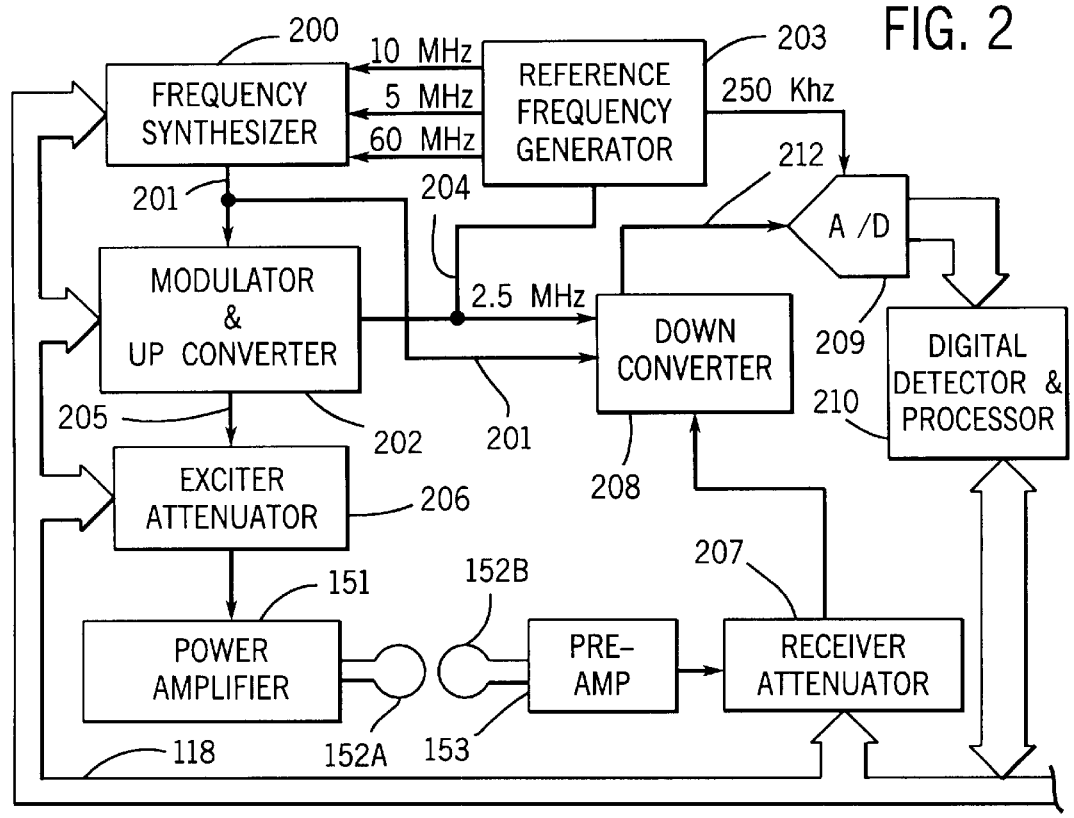
FIG. 2 is an electrical block diagram of the transceiver which forms part of the MRI system of FIG. 1.

Referring particularly to FIGS. 1 and 2, the transceiver 150 produces the RF excitation field B1 through power amplifier 151 at a coil 152A and receives the resulting signal induced in a coil 152B. As indicated above, the coils 152A and B may be separate as shown in FIG. 2, or they may be a single wholebody coil as shown in FIG. 1. The base, or carrier, frequency of the RF excitation field is produced under control of a frequency synthesizer 200 which receives a set of digital signals (CF) from the CPU module 119 and pulse generator module 121. These digital signals indicate the frequency and phase of the RF carrier signal produced at an output 201. As will be described in detail below, the frequency of this RF carrier is changed by the corrective signal produced by the field-frequency lock system 129. The commanded RF carrier is applied to a modulator and up converter 202 where its amplitude is modulated in response to a signal R(t) also received from the pulse generator module 121. The signal R(t) defines the envelope of the RF excitation pulse to be produced and is produced in the module 121 by sequentially reading out a series of stored digital values. These stored digital values may, in turn, be changed from the operator console 100 to enable any desired RF pulse envelope to be produced.

The magnitude of the RF excitation pulse produced at output 205 is attenuated by an exciter attenuator circuit 206 which receives a digital command, TA, from the backplane 118. The attenuated RF excitation pulses are applied to the power amplifier 151 that drives the RF coil 152A. For a more detailed description of this portion of the transceiver 122, reference is made to U.S. Pat. No. 4,952,877 which is incorporated herein by reference.

Referring still to FIGS. 1 and 2 the signal produced by the subject is picked up by the receiver coil 152B and applied through the preamplifier 153 to the input of a receiver attenuator 207. The receiver attenuator 207 further amplifies the signal by an amount determined by a digital attenuation signal (RA) received from the backplane 118.

The received signal is at or around the Larmor frequency, and this high frequency signal is down converted in a two step process by a down converter 208 which first mixes the NMR signal with the carrier signal on line 201 and then mixes the resulting difference signal with the 2.5 MHz reference signal on line 204. The down converted NMR signal is applied to the input of an analog-to-digital (A/D) converter 209 which samples and digitizes the analog signal and applies it to a digital detector and signal processor 210 which produces 16-bit in-phase (I) values and 16-bit quadrature (Q) values corresponding to the received signal. The resulting stream of digitized I and Q values of the received signal are output through backplane 118 to the memory module 160 where they are employed to reconstruct an image.

The 2.5 MHz reference signal as well as the 250 kHz sampling signal and the 5, 10 and 60 MHz reference signals are produced by a reference frequency generator 203 from a common 20 MHz master clock signal. For a more detailed description of the receiver, reference is made to U.S. Pat. No. 4,992,736 which is incorporated herein by reference.

Figure 3:
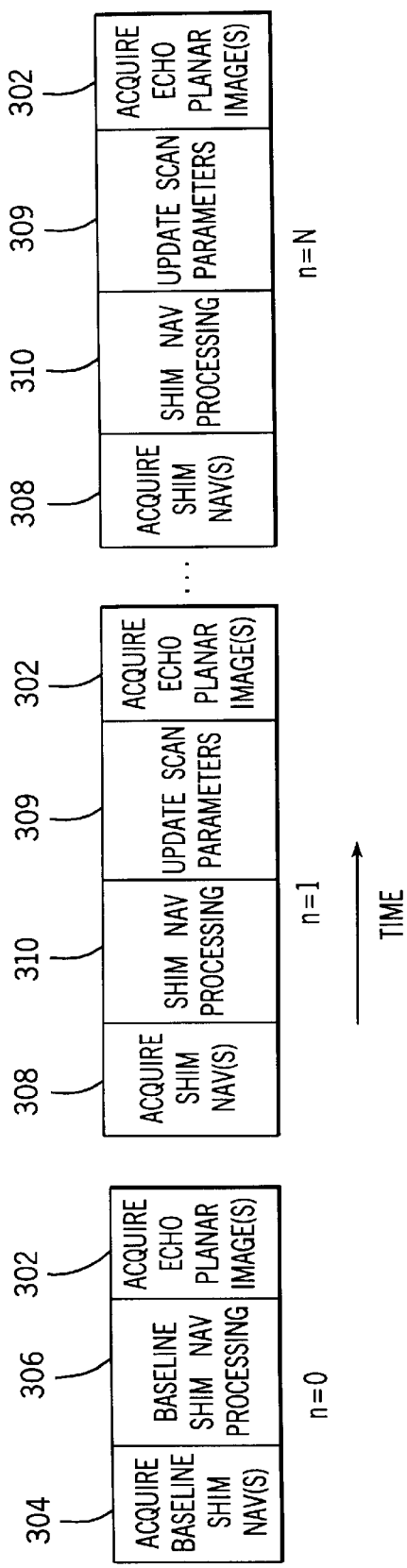
FIG. 3 is a schematic representation of a scan performed with the MRI system of FIG. 1 in which a preferred embodiment of the present invention is employed.

Referring particularly to FIG. 3 a scan for acquiring fMRI time course data is comprised of a series of single shot echo planar slice acquisitions indicated at 302. The number of acquired slices and the duration of the time course study determines the total number N of such single shot EPI acquisitions. Typically from 50 to over 1,000 slice acquisitions are acquired during an fMRI study over a period of from 1 to 20 minutes.

To practice the preferred embodiment of the invention, shim navigator pulse sequences are interleaved with the EPI imaging pulse sequences 302. An initial shim navigator pulse sequence 304 is performed and the shim navigator NMR signals acquired therein are processed at 306 to establish a baseline, or reference, value for the $B_0$ polarizing magnetic field. As will be described in detail below, prior to each subsequent EPI imaging pulse sequence 302 in the scan, a shim navigator pulse sequence 306 is performed. The acquired shim navigator NMR signals are processed as indicated at 310 to measure changes in the polarizing field ($\Delta B_0$) across the imaging volume, and these measured changes are employed to update the scan parameters at 309 for the next EPI slice acquisition 302. In the preferred embodiment the scan parameters which are updated are magnetic field gradient waveforms in the following EPI imaging pulse sequence 302. The corrective changes made to these gradient waveforms offset the phase errors which would otherwise be produced in the acquired slice image due to the change in polarizing field.

Figure 5:
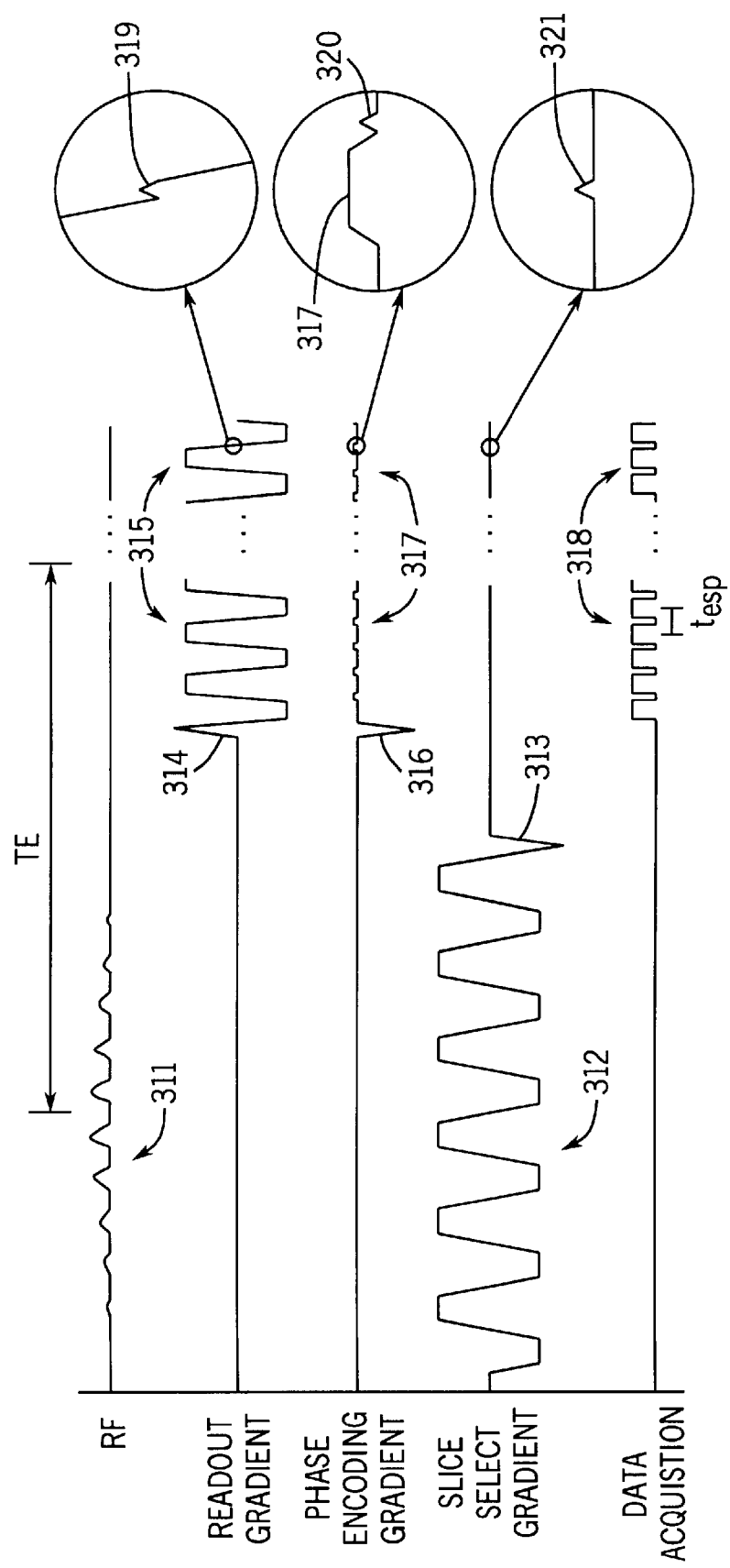
FIG. 5 is a graphic representation of a preferred EPI pulse sequence used in the scan of FIG. 3 which illustrates the corrections made to gradient waveforms in accordance with the teachings of the present invention.

Referring particularly to FIG. 5, the preferred embodiment of the EPI imaging pulse sequence 302 includes a spatial-spectral RF excitation pulse 311 which is applied in the presence of an oscillating gradient pulse 312 in the slice select direction to produce transverse magnetization in a prescribed slice within the imaging volume. The spatial-spectral pulse is used to selectively excite only water spins, and other RF pulses could also be used in place of the spatial-spectral pulse. The excited spins are rephased by an additional gradient lobe 313 on the slice select gradient. Separate NMR echo signals are acquired during a series of acquisition windows 318. Each NMR echo signal is a different view which is separately phase encoded by a phase encoding gradient 317 to acquire all of the desired k-space in the phase encode direction. The NMR echo signals are gradient recalled echoes produced by the application of an oscillating readout gradient field 315. The readout sequence is preceded by a prephasing readout gradient lobe 314 along the readout gradient axis and a prephasing gradient lobe 316 along the phase encoding gradient axis. The echo signals are produced as the readout gradient 315 oscillates between positive and negative values. Samples are taken of each NMR echo signal during each acquisition window 318 and readout gradient pulse 315. The successive NMR echo signals are separately phase encoded by a series of phase encoding gradient pulses 317. Phase encoding pulses 317 are produced as the readout gradient pulses 315 switch polarity, and each phase encoding pulse 317 steps the phase to sample a different line of k-space. K-space is sampled in monotonic order and at the prescribed echo time (TE) the phase encoding steps through $k_{pe}=0$. Echo times typically range from TE=20 to 120 ms in brain studies.

At the completion of the EPI pulse sequence, 64 separate frequency encoded samples of 64 separately phase encoded NMR echo signals have been acquired. This 64 by 64 element array of complex numbers is Fourier transformed along both of its dimensions ($k_{pe}$ and $k_{ro}$) to produce an array of image data that indicates the NMR signal magnitude along each of its two dimensions.

Due to its extended acquisition time, the EPI pulse sequence is highly sensitive to magnetic field inhomogeneities. Magnetic field inhomogeneities cause signal loss, changes in ghosting artifact, and distortion in the EPI image by dephasing the NMR spins. The distortion occurs primarily along the phase-encode direction due to the comparatively long time delay between acquisition of adjacent k-space sample points along the phase encoding axis when compared to the delay between acquisition of adjacent k-space sample points along the readout axis. This enables greater phase errors to accumulate. If the polarizing magnetic field is altered during the course of data acquisition, the distortion of the EPI image is altered, causing signal to be translated within the plane (primarily in the phase encode direction) of the image.

To first order, applying additional constant, opposing gradients during the imaging sequence may compensate for changes in the polarizing magnetic field. Ideally, the constant opposing gradients reverse phase errors for every sampled k-space data point. However, with a long, constant gradient, the resolution with which the gradient amplitudes are adjusted may not be sufficiently fine to adjust for the small changes in magnetic field observed over the course of a few minute scan. Since the degree of correction is proportional to the area of the corrective gradient waveform (the product of gradient amplitude and time), shortening the time of the applied corrective gradient pulse requires a larger gradient amplitude, effectively increasing the resolution with which the gradient amplitude may be adjusted.

Referring still to FIG. 5, shim compensation gradient pulses 319, 320 and 321 are applied along the respective readout, phase encoding and slice select gradient axes. The shim compensation gradient pulses 319, 320, 321 are applied repeatedly on each axis as the readout gradient 315 switches polarity. Shim compensation gradients reverse the phase errors accumulated over the course of the preceding echo acquisition 318, such that phase errors do not accumulate between successive NMR echoes. These corrections reduce the distortion in the phase-encode direction. The shim compensation gradients 319, 320 and 321 do not reverse phase errors accumulating during the NMR echo signal acquisition 318, which are small in comparison to errors accumulating over the entire image acquisition.

The shim compensation gradients 319, 320 and 321 may be applied at any time while the readout gradient 315 switches polarity. In the preferred embodiment, the shim compensation gradient pulses 319 on the readout gradient are applied as the readout gradient pulses 315 transition between positive and negative polarities. The shim compensation gradient pulses 320 on the phase encode gradient are applied immediately after the phase encoding pulse 317. The shim compensation gradient pulses 321 on the slice select gradient are applied simultaneously with the shim compensation gradient pulses 319 on the readout gradient. The size of the shim compensation gradient pulses 319, 320 and 321 are determined by the magnitude of the measured changes in the polarizing magnetic field.

Phase errors due to changes in the polarizing field gradient may also accrue between the time of RF excitation and the start of data acquisition. Thus, shim compensation may also include reversing those errors before the start of data acquisition. Additional gradient waveforms may be played out on each axis specifically for the purpose of reversing phase errors between the RF and data acquisition. Alternatively, the area under the RF rephasing gradient 313 and/or prephasing gradient lobes 314 and 316 may be adjusted to compensate for the phase errors. In either case of playing out additional gradients or adjusting the gradient amplitudes of the rephasing or prephasing gradient lobes, the change in area for each axis is equal to the product of the change in gradient shim measured by the shim NAV pulse sequence along that axis and the time between RF excitation and data acquisition. For spin echo sequences, the change in area is equal to the product of the change in gradient shim measured by the shim NAV pulse sequence along that axis and the difference of the time duration between RF excitation and RF refocusing and the time duration between RF refocusing and the start of data acquisition. These areas may need to be adjusted slightly for imperfections in the timing of the RF excitation. The manner in which these changes are measured and the resulting sizes of the shim compensation gradient pulses will now be described.

Figure 4:
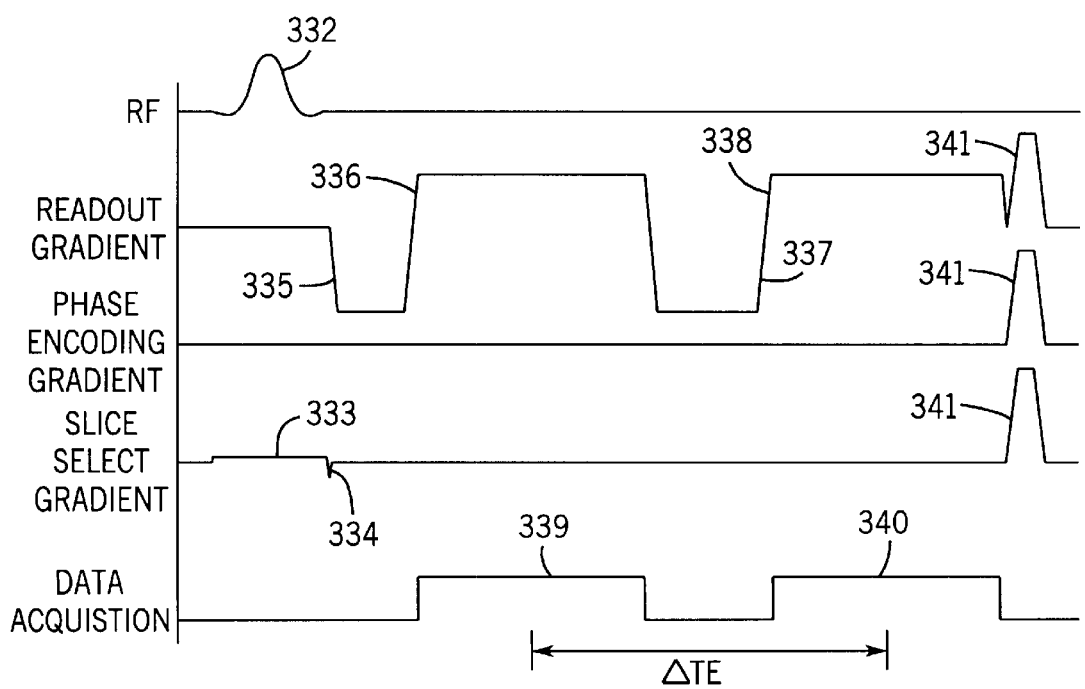
FIG. 4 is a graphic representation of a preferred shim navigator signal pulse sequence employed in the scan of FIG. 3.

To correct for changes in polarizing magnetic field induced by periodic or randomly occurring patient motion, the magnetic field must be periodically measured. This is accomplished with the interleaved shim navigator pulse sequences 308 as shown in FIG. 3. Referring particularly to FIG. 4, each shim navigator pulse sequence 308 includes an RF excitation pulse 332 which is applied in the presence of a gradient pulse 333 in the slice select direction to produce transverse magnetization in a prescribed slice. In the preferred embodiment, the prescribed slice encompasses the entire field of view of the imaging pulse sequences and the RF excitation pulse 332 has a low flip-angle. Transverse magnetization is thus produced across the imaging volume and the excited spins are rephased by an additional gradient lobe 334 on the slice select gradient waveform. The NMR echo signals are acquired during two data acquisition windows 339 and 340 during the application of two readout gradient pulses 336 and 338. The first readout gradient pulse 336 is preceded with a prephasing gradient lobe 335 of opposite polarity. Between the application of readout gradient pulses, a phase reversal gradient lobe 337 is applied of opposite polarity. Thus, phase accrual due to the acquisition sequence should be equivalent for the NMR gradient-recalled echo signals acquired during the acquisition windows 339 and 340. After the second NMR echo signal 340 is acquired, killer gradient pulses 341 are applied along each gradient axes to dephase any residual magnetization. The echo time of the first NMR echo signal acquired at 339 occurs as the center of k-space is sampled along the readout gradient axis. Likewise, the echo time of the second NMR echo signal acquired at 340 occurs as the center of k-space is sampled. The difference between the two echo signal times is denoted $\Delta TE$, and in the preferred embodiment is in the range of 2 to 10 ms.

At the completion of each shim NAV pulse sequence 308, two separate frequency encoded NMR echo signals are sampled and stored. These two 1-D arrays of complex numbers are Fourier transformed to produce two 1-D projections of the NMR signal magnitude and phase along the readout gradient direction which are separated by time $\Delta TE$. Deviation of the polarizing magnetic field from the primary magnetic field across the imaging volume as a function of position in the readout direction, $X_{ro}$, is then obtained from the phase difference ($\Delta\phi$) between the two 1-D projections:

$$\Delta B_0(x_{ro}) = \frac{\Delta\phi(x_{ro})}{\gamma \Delta TE} \quad (1)$$

where:
$\gamma$=the gyromagnetic constant
$X_{ro}$=Position along the readout axis
$\Delta\phi(X_{ro})$=phase difference at locations along the readout axis.

The shim NAV pulse sequence 308 will measure the current $\Delta B_0$ as a function of position along the readout axis $X_{ro}$. By subtracting the current $\Delta B_0$ signal from that obtained from the baseline shim NAV acquisition 304, one can measure the changes in the polarizing field ($\delta B_0$) as a function of position ($X_{ro}$) that have occurred since the baseline acquisition was acquired. The slope of a line fitted to the $\delta B_0(X_{ro})$ values yields the measured change in shim gradient ($\delta G_{ro}$) in the shim NAV readout direction. The amplitude of the compensation gradient along the NAV readout direction can then be adjusted such that the area under each shim compensation gradient in the imaging pulse sequence for the orientation of that particular shim NAV is equal to $\delta G_{ro} \cdot t_{esp}$. By applying shim NAV pulse sequences with readout gradients in three orthogonal directions, linear changes in the polarizing field $B_0$ in arbitrary directions within the imaging volume may be detected as linear combinations of the results of the three orthogonal shim NAVs. The corresponding gradient waveforms in the imaging pulse sequence are changed to compensate for these linear changes.

The DC term of the line (i.e. the value of the line at the center of the FOV) fitted to the $\delta B_0(X_{ro})$ values yields the measured change in reference frequency. While the shim compensation gradients reverse position dependent phase errors, a phase error that is relatively constant across the object may still remain. The change in reference frequency is independently measured by each shim NAV pulse sequence, and is ideally equal. The measured change in reference frequency from any shim NAV, or, average of multiple shim NAVs in arbitrary directions, can be used to correct the data by either applying phase corrections to the acquired data prior to reconstruction, or by prospectively altering the reference frequency 201 of the transceiver 150 during data acquisition.

Figure 6:
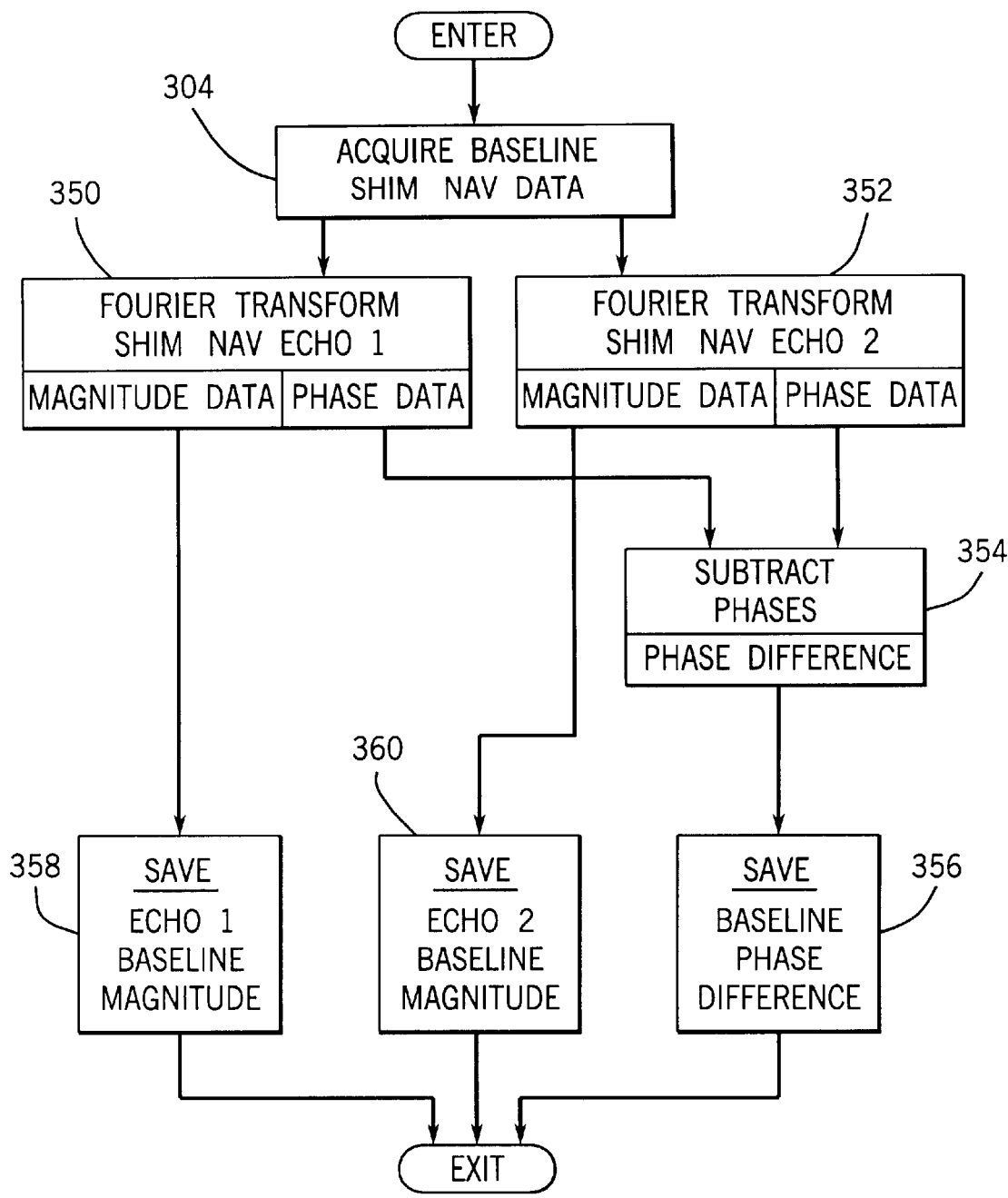
FIG. 6 is a flow chart of the steps used to process a baseline shim navigator signal acquired in the scan of FIG. 3.

Referring particularly to FIGS. 3 and 6, the baseline shim navigator signal data is acquired once 304 at the beginning of the scan and immediately processed at 306 to provide baseline information against which subsequent measurements are compared. As indicated at process blocks 350 and 352, the respective first and second shim navigator signals are Fourier transformed and both the magnitude and phase at each resulting complex value is calculated. The phase difference between echo 1 and echo 2 is calculated at process block 354 and saved for later use at block 356. This phase difference as a function of position along the navigator readout axis is proportional to the baseline polarizing field magnitude. The magnitudes of echo 1 and echo 2 are also saved for later use at blocks 358 and 360.

Figure 7:
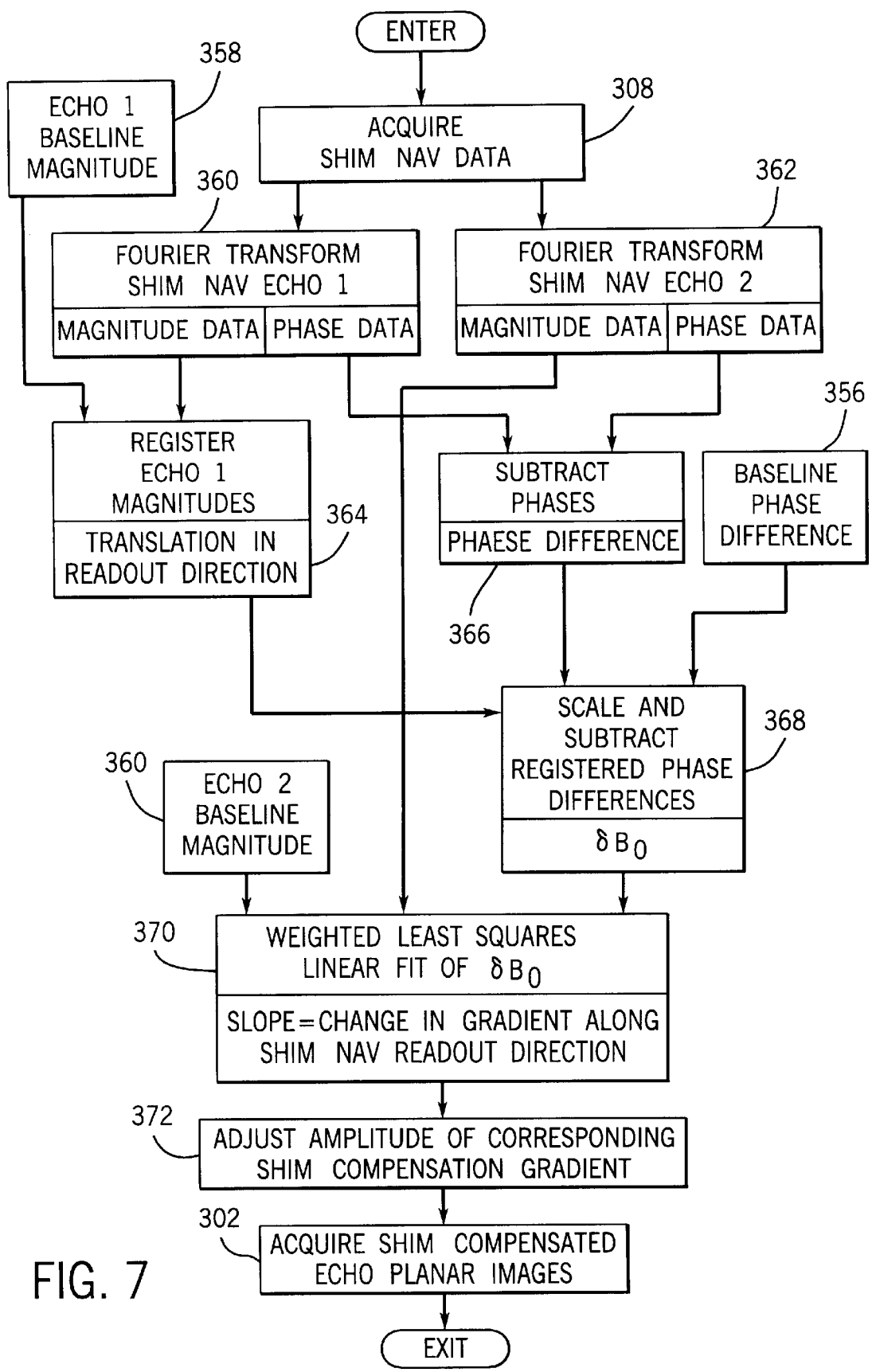
FIG. 7 is a flow chart of the steps used to process subsequent shim navigator signals acquired in the scan of FIG. 3.

Referring particularly to FIGS. 3 and 7, subsequent shim navigator signals are acquired at 308 and processed at 310. Each shim navigator echo signal is Fourier transformed at process blocks 360 and 362 and the magnitude and phase at each resulting complex value in the 1D projection array are calculated. As indicated at process block 364, the resulting magnitude data for echo 1 is registered with the baseline magnitude data 358 for echo 1 using a least squares fit. This shifts the acquired shim navigator echo data to account for any translational motion of the subject along the readout axis between the baseline shim NAV acquisition and the current shim NAV acquisition. The magnitude data from the first echo is used for registration because the signal is more stable and has higher SNR due to its shorter echo time. As indicated by process block 366, the next step is to determine the phase difference between the two shim NAV echo signals in the current shim NAV acquisition. As indicated above, this phase difference provides a measure of the current polarizing field magnitude.

The next step is to calculate the change in polarizing field $\delta B_0$ that has occurred as indicated at process block 368. This is accomplished by shifting the current phase difference measurement to register it with the baseline phase difference 356 and then subtracting the registered phase difference values. The result is scaled by $(\gamma \cdot \Delta TE)^{-1}$ to produce the change in polarizing field $\delta B_0$. As indicated at process block 370, the resulting $\delta B_0(X_{ro})$ is then linearly fitted using a least squares linear fit weighted by the product of the magnitude data from echo 2 of the baseline shim NAV 360 and echo 2 of the current shim NAV 362. The magnitude data from the second echoes is used to weight the fit because the signal has lower SNR, and regions of the phase difference signals corresponding to areas of low signal may be noisy. The slope of the linear fit is the change in shim gradient which is required in the EPI pulse sequence along the readout direction of the shim NAV. This value is used to adjust the amplitude of the corresponding shim compensation gradient 319, 320 or 321 in the EPI pulse sequence at process block 372 prior to the next image acquisition 302.

In some clinical applications it may be necessary only to correct along one axis of patient motion, in which case only a single shim NAV pulse sequence is interleaved and processed as described above. If patient motion and consequent changes in the polarizing field may occur along more than one axis, then a set of two or three shim NAVs with orthogonal readout gradients are interleaved during the scan. For example, data acquired with a shim NAV pulse sequence having a readout gradient corresponding to the readout gradient in the EPI pulse sequence would be processed as described above to produce the shim compensation pulses 319. Similarly, data from shim NAV pulse sequences having readout gradients corresponding to the EPI pulse sequence phase encoding and slice select axes is used to produce the shim compensation pulses 320 and 321.

The measured change in position independent polarizing magnetic field can also be prospectively corrected by adjusting the reference frequency of the transceiver 150. Additionally, the measured change in polarizing magnetic field as a function of the slice-select direction in the EPI pulse sequence may be corrected by changing the reference frequency of the transceiver instead of applying the shim compensation gradients on the slice-select axis. The measured change in polarizing magnetic field as a function of the slice-select direction is constant for each slice-position. Thus, the corresponding reference frequency change for the change in polarizing magnetic field at each slice can be used to adjust the reference frequency of the transceiver 150. To correct for both the change in polarizing magnetic field as a function of the slice-select position and the position independent polarizing magnetic field, the slice-dependent change in reference frequency would be added to the position independent change in reference frequency, and the reference frequency of the transceiver would be updated with these values on a slice-by-slice basis. While the adjustment of the transceiver reference frequency will correct for slice-dependent translations caused by changes in polarizing magnetic field along the slice-select direction, it will not correct for potential intravoxel dephasing.

What is claimed is:

1. A method for performing a magnetic resonance imaging scan of a subject with a magnetic resonance imaging (MRI) system, the steps comprise:
   a) performing a baseline shim navigator pulse sequence with the MRI system to acquire baseline shim navigator data indicative of the polarizing magnetic field magnitude along a selected direction across the subject;
   b) performing a series of imaging pulse sequences with the MRI system to acquire image data from which one or more images of the subject may be reconstructed;
   c) performing a series of shim navigator pulse sequences with the MRI system which are interleaved with the series of imaging pulse sequences to acquire shim navigator data indicative of the polarizing magnetic field magnitude along the selected direction across the subject prior to the performance of each imaging pulse sequence;
   d) calculating the change in polarizing magnetic field magnitude prior to performing each imaging pulse sequence using shim navigator data and baseline shim navigator data; and
   e) changing a scan parameter in the imaging pulse sequence based on the calculated change in polarizing magnetic field magnitude.

2. The method as recited in claim 1 in which a plurality of images are acquired over a period of time.

3. The method as recited in claim 2 in which the subject is a human brain.

4. The method as recited in claim 1 in which the imaging pulse sequence is an echo planar imaging (EPI) pulse sequence which acquires sufficient image data from which an image can be reconstructed.

5. The method as recited in claim 1 in which the imaging pulse sequence includes imaging gradient waveforms and the changed scan parameter is one of said imaging gradient waveforms.

6. The method as recited in claim 5 in which the imaging pulse sequence includes a slice select gradient waveform and the changed scan parameter is the slice select gradient waveform.

7. The method as recited in claim 5 in which the imaging pulse sequence includes a readout gradient waveform and the changed scan parameter is the readout gradient waveform.

8. The method as recited in claim 5 in which the imaging pulse sequence includes a phase encoding gradient waveform and the changed scan parameter is the phase encoding gradient waveform.

9. The method as recited in claim 1 in which the imaging pulse sequence includes a plurality of imaging gradient waveforms that direct the MRI system to produce a corresponding plurality of magnetic field gradients along a plurality of corresponding gradient axes, and the changed scan parameter is a change in a plurality of said imaging gradient waveforms.

10. The method as recited in claim 1 in which the shim navigator pulse sequence includes the generation of a first NMR echo signal and a second NMR echo signal and the data indicative of the polarizing magnetic field magnitude is calculated from the difference in phase between the first and second NMR echo signals.

11. The method as recited in claim 1 in which step d) is performed by:
 i) registering the baseline shim navigator data with the shim navigator data; and
 ii) calculating the phase difference between the registered baseline shim navigator data and the shim navigator data.

12. The method as recited in claim 11 in which step e) is performed by:
 iii) calculating a change in a magnetic field gradient employed in the imaging pulse sequence; and
 iv) changing the magnetic field gradient employed in the subsequent imaging pulse sequence.

13. The method as recited in claim 1 in which the imaging pulse sequence includes a readout gradient waveform that directs the MRI system to produce a magnetic field gradient that alternates in polarity to define a plurality of data acquisition windows during which a corresponding plurality of NMR signals are acquired, and the changed scan parameter is a shim compensation gradient applied between each data acquisition.

14. The method as recited in claim 13 in which the shim compensation gradient is added to the readout gradient waveform.

15. The method as recited in claim 13 in which the imaging pulse sequence includes a phase encoding gradient waveform that directs the MRI system to produce a magnetic field gradient in a direction orthogonal to the readout gradient, and in which the shim compensation gradient is added to the phase encoding gradient waveform.

16. A method for performing a magnetic resonance imaging scan of a subject with a magnetic resonance imaging (MRI) system, the steps comprising:
 a) performing a series of imaging pulse sequences with the MRI system to acquire image data from an imaging volume and from which one or more images of the subject may be reconstructed;
 b) performing a series of shim navigator pulse sequences with the MRI system which are interleaved with the series of imaging pulse sequences to acquire shim navigator data indicative of a polarizing magnetic field magnitude;
 c) calculating changes in the polarizing magnetic field within the imaging volume using acquired shim navigator data; and
 d) prospectively changing the imaging pulse sequence during the performance of step a) to compensate for changes in the polarizing magnetic field that occur in the imaging volume;
 where performance of the shim navigator pulse sequence includes:
  i) producing an RF excitation pulse that produces transverse magnetization throughout the imaging volume;
  ii) producing a readout magnetic field gradient along one direction, which alternates in polarity to produce two shim navigator echo signals that are separated in time; and
  iii) acquiring the two shim navigator echo signals.

17. The method as recited in claim 16 in which step c) includes:
 Fourier transforming the two shim navigator echo signals; and
 calculating the phase difference between the two transformed shim navigator echo signals.

18. The method as recited in claim 16 in which the changes calculated in step c) include changes in the polarizing field within the imaging volume in the one direction of the shim navigator pulse sequence readout gradient.

* * * * *